United States Patent
Lu

(10) Patent No.: US 11,043,250 B1
(45) Date of Patent: Jun. 22, 2021

(54) BUFFER CONTROL OF MULTIPLE MEMORY BANKS

(71) Applicant: Taiwan Semiconductor Manufacturing Company Limited, Hsinchu (TW)

(72) Inventor: Shih-Lien Linus Lu, Hsinchu (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 0 days.

(21) Appl. No.: 16/991,614

(22) Filed: Aug. 12, 2020

(51) Int. Cl.
*G11C 7/22* (2006.01)
*G11C 7/10* (2006.01)

(52) U.S. Cl.
CPC ............ *G11C 7/222* (2013.01); *G11C 7/1036* (2013.01); *G11C 7/1057* (2013.01); *G11C 7/1084* (2013.01)

(58) Field of Classification Search
CPC ..... G11C 7/222; G11C 7/1084; G11C 7/1057; G11C 7/1036
See application file for complete search history.

(56) References Cited

U.S. PATENT DOCUMENTS

| | | | |
|---|---|---|---|
| 10,044,646 B1 * | 8/2018 | Detwiler | H04L 49/90 |
| 2014/0095745 A1 * | 4/2014 | Kawahara | G06F 5/065 |
| | | | 710/53 |
| 2015/0089095 A1 * | 3/2015 | Stark | G06F 9/3004 |
| | | | 710/54 |
| 2015/0089096 A1 * | 3/2015 | Stark | G06F 3/0656 |
| | | | 710/54 |
| 2016/0294735 A1 * | 10/2016 | Panchagnula | H04L 49/9005 |
| 2016/0315883 A1 * | 10/2016 | Bang | H04L 49/901 |

* cited by examiner

*Primary Examiner* — Tri M Hoang
(74) *Attorney, Agent, or Firm* — Foley & Lardner LLP

(57) ABSTRACT

Disclosed herein are related to operating a memory system including memory banks and buffers. Each buffer may perform a write process to write data to a corresponding memory bank. In one aspect, the memory system includes a buffer controller including a queue register, a first pointer register, a second pointer register, and a queue controller. In one aspect, the queue register includes entries, where each entry may store an address of a corresponding memory bank. The first pointer register may indicate a first entry storing an address of a memory bank, on which the write process is predicted to be completed next. The second pointer register may indicate a second entry to be updated. The queue controller may configure the queue register according to the first pointer register and the second pointer register, and configure one or more buffers to perform the write process, according to the entries.

20 Claims, 9 Drawing Sheets

| Clk | incoming | Q0 | Q1 | Q2 | Q3 | HP | TP | WR done? | Updates of pointers under condition | Action to bank |
|---|---|---|---|---|---|---|---|---|---|---|
| 0 | B0_1 | * | * | * | * | Q0 | Q0 | | | |
| 1 | B1_1 | B0_1 | * | * | * | Q0 | Q0 | F | Q entry pointed by TP empty;TP++; | Write B0_1 |
| 2 | B2_1 | B0_1 | B1_1 | * | * | Q0 | Q1 | F | Q entry pointed by TP empty;TP++; | Write B1_1 |
| 3 | B3_1 | B0_1 | B1_1 | B2_1 | * | Q0 | Q2 | F | Q entry pointed by TP empty;TP++; | Write B2_1 |
| 4 | B0_2 | B0_1 | B1_1 | B2_1 | B3_1 | Q0 | Q3 | F | TP++;write not done HP stay;if(next HP==next TP)blk next | Write B3_1 |
| 5 | B0_2 | B0_1 | B1_1 | B2_1 | B3_1 | Q0 | Q0 | T | TP stay;write B0 done then HP++ | |
| 6 | B1_2 | B0_2 | B1_1 | B2_1 | B3_1 | Q1 | Q0 | T | TP++;write B1 done then HP++ | Write B0_2 |
| 7 | B2_2 | B0_2 | B1_2 | B2_1 | B3_1 | Q2 | Q1 | T | TP++;write B2 done then HP++ | Write B1_2 |

FIG. 7

| Clk | incoming | Q0 | Q1 | Q2 | Q3 | HP | TP | WR done? | Updates of pointers under condition | Action to banks |
|---|---|---|---|---|---|---|---|---|---|---|
| 0 | B0_1 | * | * | * | * | Q0 | Q0 | | | |
| 1 | B0_2 | B0_1 | * | * | * | Q0 | Q0 | F | Q entry pointed by TP empty;TP++; | Write B0_1 |
| 2 | B0_3 | B0_1 | B0_2 | * | * | Q0 | Q1 | F | Q entry pointed by TP empty;TP++; | |
| 3 | B0_4 | B0_1 | B0_2 | B0_3 | * | Q0 | Q2 | F | Q entry pointed by TP empty;TP++; | |
| 4 | B0_5 | B0_1 | B0_2 | B0_3 | B0_4 | Q0 | Q3 | F | TP++;write not done HP stay;if(next HP==next TP)blk next | |
| 5 | B0_5 | B0_1 | B0_2 | B0_3 | B0_4 | Q0 | Q0 | T | TP stay;write B0 done thus HP++ | |
| 6 | B0_6 | B0_5 | B0_2 | B0_3 | B0_4 | Q1 | Q0 | F | TP++;write not done HP stay;if(next HP==next TP)blk next | Write B0_2 |
| 7 | B0_6 | B0_5 | B0_2 | B0_3 | B0_4 | Q1 | Q1 | F | TP stay;write not done HP stay;if(next HP==next TP)blk next | |
| 8 | B0_6 | B0_5 | B0_2 | B0_3 | B0_4 | Q1 | Q1 | F | TP stay;write not done HP stay;if(next HP==next TP)blk next | |
| 9 | B0_6 | B0_5 | B0_2 | B0_3 | B0_4 | Q1 | Q1 | F | TP stay;write not done HP stay;if(next HP==next TP)blk next | |
| 10 | B0_6 | B0_5 | B0_2 | B0_3 | B0_4 | Q1 | Q1 | T | TP stay;write B0 done then HP++ | |
| 11 | B0_7 | B0_5 | B0_6 | B0_3 | B0_4 | Q2 | Q1 | F | TP++;write not done HP stay;if(next HP==next TP)blk next | Write B0_3 |

BUFFER CONTROL OF MULTIPLE MEMORY BANKS

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is an example table showing an operation of the buffer controller of FIG. 1, in accordance with some embodiments.

FIG. 8 is another example table showing an operation of the buffer controller of FIG. 1, in accordance with some embodiments.

DETAILED DESCRIPTION

Figure 1:
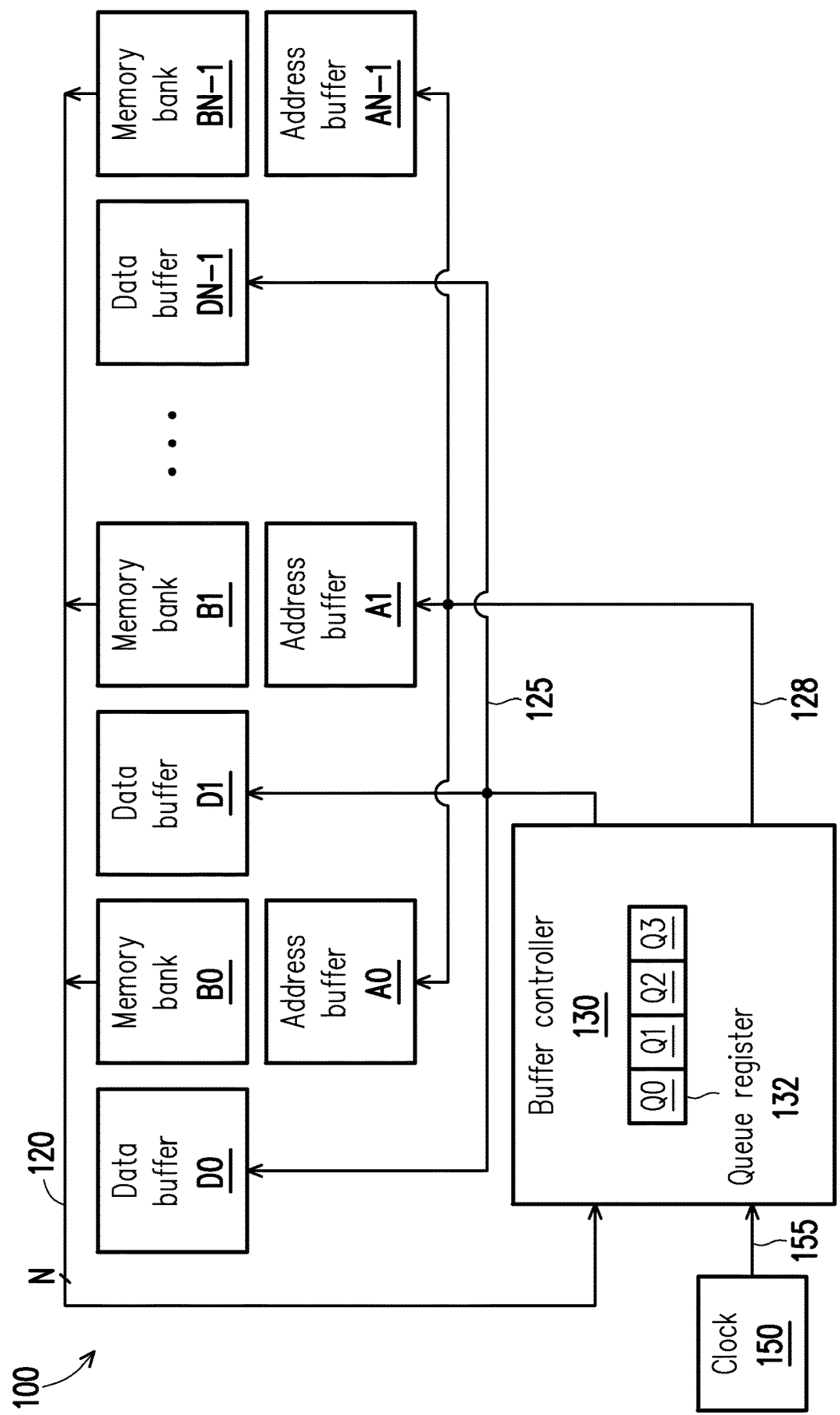
FIG. 1 is a diagram of a memory system, in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to a system, a device, and a method of configuring, by a buffer controller, a plurality of buffers to write data to a plurality of memory banks. In some embodiments, each buffer is coupled to a corresponding one of the plurality of buffers. The buffer controller may configure two or more buffers to perform a write process on corresponding memory banks for a number of clock cycles to write data in parallel or in a pipeline configuration.

In some embodiments, the buffer controller includes a queue register, a first pointer register and a second pointer register. In one aspect, the queue register includes a set of entries, where each entry may store an address of a corresponding memory bank to perform the write process to write data. In one aspect, the first pointer register stores a first pointer. The first pointer may indicate a first entry of the set of entries storing an address of a memory bank, among the plurality of memory banks, on which the write process is predicted to be completed next. In one aspect, the second pointer register stores a second pointer. The second pointer may indicate a second entry of the set of entries to be updated. The buffer controller may update the second entry, according to an input bank address of a target memory bank to store input data. In response to updating the second entry, the buffer controller may shift the second pointer register, such that the second pointer may indicate a subsequent entry of the second entry. When the first pointer and the second pointer indicate the same entry, the buffer controller may block or prevent updating the queue register. In response to the write process on the memory bank having the address stored by the first entry is completed, the buffer controller may shift the first pointer register, such that the first pointer may indicate a subsequent entry of the first entry. When the first pointer and the second pointer indicate different entries, the buffer controller may unblock updating the queue register, thereby allowing the queue register to be updated. Hence, the buffer controller may configure the set of entries of the queue register according to the first pointer register and the second pointer register. Moreover, the buffer controller may configure one or more buffers of the plurality of buffers according to the set of entries to perform the write process.

Advantageously, the buffer controller employing the first pointer register and the second pointer register can manage or operate different buffers in an efficient manner. In one implementation, each buffer may include a corresponding counter that keeps track of a number of clock cycles elapsed after the beginning of the write process, or a number of clock cycles remaining to complete the write process. However, a number of counters to keep track of the number of clock cycles elapsed or remaining scales according to a number of memory banks. Moreover, configuring or controlling multiple buffers to perform the write process based on a large number of counters may involve a complex computation. By utilizing the buffer controller with a first pointer register and a second pointer register to update or maintain a queue register for configuring or controlling different buffers, a large number (e.g., thousands) of counters to keep track of a number of clock cycles elapsed or a number of clock cycles remaining can be omitted. By omitting a large number of counters, an amount of areas or hardware resources can be conserved. Moreover, updating or maintaining the queue register for configuring or controlling different buffers without a large number of counters can be performed with less complexity.

FIG. 1 is a diagram of a memory system 100, in accordance with one embodiment. In some embodiments, the memory system 100 includes memory banks B0 . . . BN-1, data buffers D0 . . . DN-1, address buffers A0 . . . AN-1, a buffer controller 130, and a clock 150. In one configuration, each memory bank BX is electrically coupled to a corresponding data buffer DX and a corresponding address buffer AX. Moreover, in one configuration, each memory bank B0 . . . BN-1 is electrically coupled to the buffer controller 130, where the buffer controller 130 is electrically coupled to the data buffers D0 . . . DN-1, the address buffers A0 . . . AN-1 and the clock 150. In this configuration, these components may operate together to store data. In some embodiments, the memory system 100 includes more, fewer, or different components than shown in FIG. 1.

In some embodiments, the memory bank BX is a hardware component or a circuit that stores data. The memory bank BX may include multiple volatile memory cells or non-volatile memory cells. For example, in some embodiments, the memory bank BX may include NAND flash memory cells. In other embodiments, the memory bank BX may include NOR flash memory cells, Static Random Access Memory (SRAM) cells, Dynamic Random Access Memory (DRAM) cells, Magnetoresistive Random Access Memory (MRAM) cells, Phase Change Memory (PCM) cells, Resistive Random Access Memory (ReRAM) cells, 3D XPoint memory cells, ferroelectric random-access memory (FeRAM) cells, and other types of memory cells. In one aspect, each memory cell is identified by a corresponding cell address, where each memory bank BX is identified by a corresponding bank address.

In some embodiments, the data buffer DX is a hardware component or a circuit that receives input data to be stored and applies the input data to the memory bank BX to write the input data. In some embodiments, the address buffer AX is a hardware component or a circuit that receives a cell address of the memory bank BX, at which the input data is to be stored, and configures the memory bank BX to write the input data at the cell address. The data buffer DX may receive the input data from a host processor (not shown) or the buffer controller 130, and the address buffer AX may receive the cell address from the host processor or the buffer controller 130. In one aspect, the data buffer DX receives a control signal 125 from the buffer controller 130 and the address buffer AX receives a control signal 128 from the buffer controller 130. In response to the control signals 125, 128 having a first state (e.g., logic state '1'), the data buffer DX and the address buffer AX may perform a write process to write input data to a memory cell corresponding to the cell address. In response to the control signals 125, 128 having a second state (e.g., logic state '0'), the data buffer DX and the address buffer AX may not perform the write process. Hence, the data buffer DX and the address buffer AX can be configured in a synchronous manner to perform the write process on the memory bank BX, according to the control signals 125, 128 from the buffer controller 130.

In some embodiments, the buffer controller 130 is a hardware component or an integrated circuit that configures the data buffers D0 . . . DN-1 and the address buffers A0 . . . AN-1 to perform the write process. In some embodiments, the buffer controller 130 includes a queue register 132 including a set of entries (e.g., Q0, Q1, Q2, Q3). Each entry may be a storage circuit or a register that stores a bank address of a corresponding memory bank, on which to perform the write process. Although the queue register 132 shown in FIG. 1 includes four entries Q0 . . . Q3, the queue register 132 may include a different number of entries. In one aspect, the buffer controller 130 receives an input bank address or a vector of bank addresses from the host processor. If an entry is empty, the buffer controller 130 may update the entry to store the input bank address. If all of the entries are full, the buffer controller 130 may block updating the entries, and may instruct or cause the host processor to stop sending input bank addresses until updating the entries is unblocked. According to the bank addresses stored by the queue register 132, the buffer controller 130 may generate control signals 125 for configuring the data buffers D0 . . . DN-1 and provide the control signals 125 to the data buffers D0 . . . DN-1. Similarly, according to the bank addresses stored by the queue register 132, the buffer controller 130 may generate control signals 128 for configuring the address buffers A0 . . . AN-1 and provide the control signals 128 to the address buffers A0 . . . AN-1. For example, if an entry Q0 has a bank address of the memory bank B0 and the memory bank B0 is clear-to-write, the buffer controller 130 may generate the control signals 125, 128 to configure the data buffer D0 and the address buffer A0 to perform the write process on the memory bank B0.

In one configuration, the buffer controller 130 configures the data buffers D0 . . . DN-1 and the address buffers A0 . . . AN-1 according to a clock cycle corresponding to a period of a clock signal 155 from the clock 150. In one example, the buffer controller 130 configures a data buffer DX and an address buffer AX to perform the write process for a predetermined number of clock cycles (e.g., 5 or 7) to successfully write input data to a memory bank BX. In one aspect, the buffer controller 130 provides the control signals 125, 128 to the data buffers D0 . . . DN-1 and the address buffers A0 . . . AN-1 according to a phase of the clock signal 155, such that the write process can be performed on multiple memory banks in parallel, or in a pipeline configuration in a synchronous manner.

In one aspect, the buffer controller 130 receives, from each memory bank BX, a write complete signal 120X indicating that the write process on the memory bank BX is completed and manage or update the queue register 132 according to the write complete signal 120X. In one example, the write complete signal 120X having a first state (e.g., logic '1') may indicate that the write process on the memory bank BX is complete. In one example, the write complete signal 120X having a second state (e.g., logic '0') may indicate that the write process on the memory bank BX is still pending. In one approach, according to the write complete signals 120, the buffer controller 130 may determine whether memory banks having bank addresses stored by the queue register 132 have completed the write process or not. If a memory bank having a bank address stored by an entry has completed the write process, the buffer controller 130 may clear the entry and allow the entry to be updated with an input bank address from the host processor. In case a memory bank having a bank address stored by an entry has not completed the write process, the buffer controller 130 may disallow or block the entry from being updated.

Detailed descriptions on example configurations and operations of the buffer controller 130 are provided below with respect to FIGS. 2 through 8.

Advantageously, the buffer controller 130 can be implemented in an efficient manner. In one implementation, each buffer D0 . . . DN−1, A0 . . . AN−1 may include a corresponding counter that keeps track of a number of clock cycles elapsed after the beginning of the write process, or a number of clock cycles remaining to complete the write process. However, for a large number of memory banks (e.g., thousand or more), a large number of counters to keep track of the number of clock cycles elapsed or remaining can consume a large amount of area or hardware resources. Moreover, configuring or controlling multiple buffers to perform the write process based on a large number of counters may involve a complex computation. By employing the buffer controller 130 including the queue register 132, an amount of areas or hardware resources can be conserved. Moreover, updating or maintaining the queue register 132 for configuring or controlling different buffers without a large number of counters can be performed with less complexity.

Figure 2:
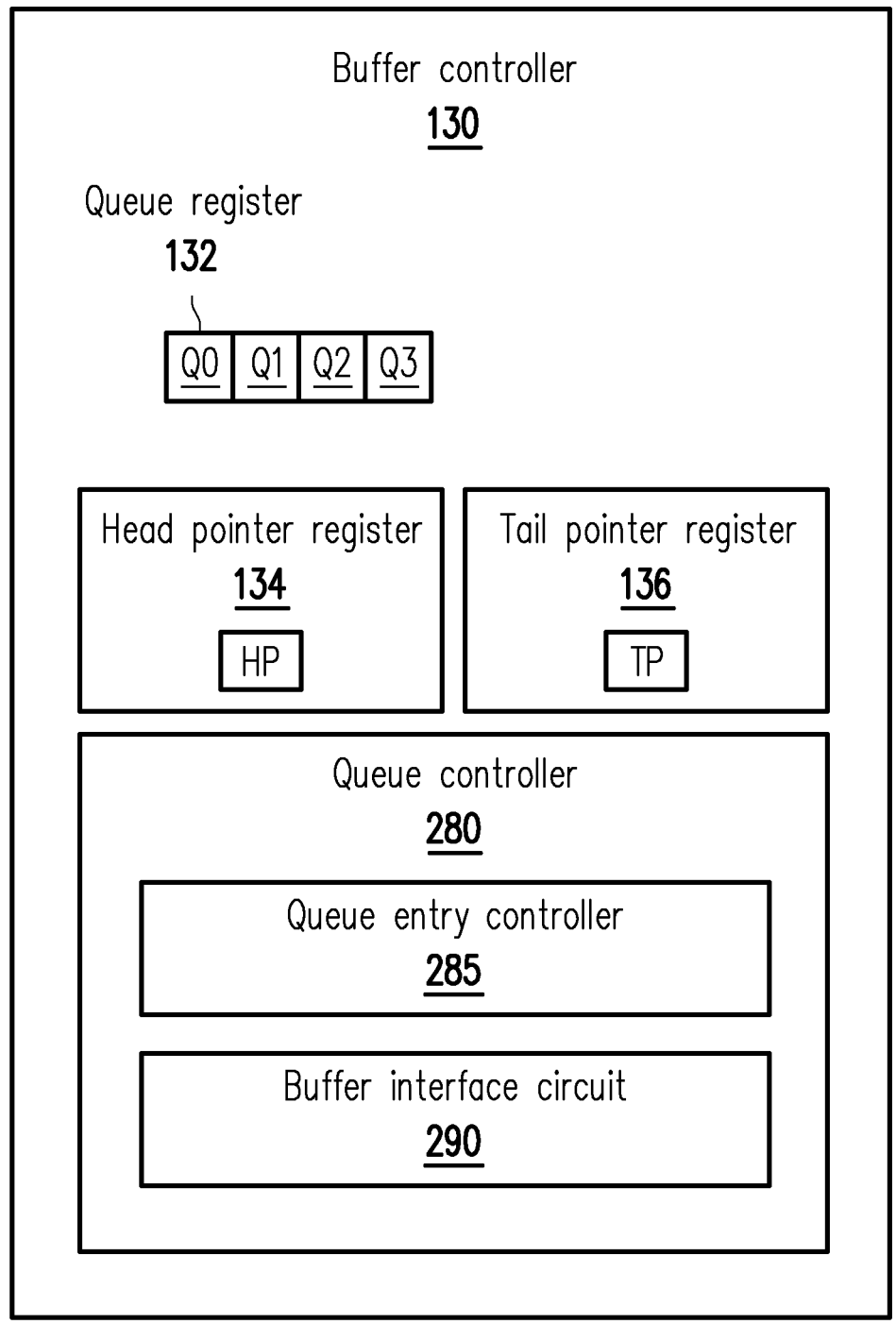
FIG. 2 is a diagram of a buffer controller of the memory system of FIG. 1, in accordance with some embodiments.

FIG. 2 is a diagram of the buffer controller 130 of the memory system 100 of FIG. 1, in accordance with some embodiments. In some embodiments, the buffer controller 130 includes a head pointer register 134, a tail pointer register 136, and a queue controller 280. In some embodiments, the head pointer register 134 and the tail pointer register 136 are embodied as a counter or a shift register (e.g., barrel shifter). In one aspect, the head pointer register 134 stores a head pointer (HP). HP may indicate a first entry of the set of entries storing a bank address of a memory bank, among the plurality of memory banks, on which the write process is predicted to be completed next. In one aspect, tail pointer register 136 stores a tail pointer (TP). TP may indicate a second entry of the set of entries to be updated. According to HP and TP, the queue controller 280 may update, control, and/or maintain the queue register 132. Moreover, the queue controller 280 may generate the control signals 125, 128 to configure one or more of the address buffers A0 . . . AN−1 and the data buffers D0 . . . DN−1. In some embodiments, the buffer controller 130 includes more, fewer, or different components than shown in FIG. 2.

In some embodiments, the queue controller 280 includes a queue entry controller 285 and a buffer interface circuit 290. In one aspect, the queue entry controller 285 is a hardware component or a circuit that configures, updates, or maintains the set of entries of the queue register 132. In one aspect, the buffer interface circuit 290 is a hardware component or a circuit that reads the set of entries to obtain bank addresses stored by the set of entries, and generates control signals 125, 128 for configuring buffers (e.g., address buffers and data buffers) according to the obtained bank addresses.

In some embodiments, the queue entry controller 285 configures, updates, or maintains the queue register 132, according to HP and TP. The queue controller 280 may be implemented as a state machine or a logic circuit. In one aspect, TP indicates a next entry among the set of entries to be updated. The queue entry controller 285 may receive an input bank address of a target memory bank to store input data and update an entry indicated by TP according to the input bank address of the target memory bank. In one approach, the queue entry controller 285 receives an input bank address at a beginning of a clock cycle or before beginning the clock cycle and stores the input bank address. In response to updating the entry indicated by TP, the queue entry controller 285 may shift the tail pointer register 136, such that TP indicates a subsequent entry of the updated entry. Assuming for an example that TP indicates an entry Q2, in response to updating the entry Q2, the queue entry controller 285 may shift the tail pointer register 136 such that TP indicates an entry Q3. In one aspect, HP indicates an entry storing a bank address of a memory bank, among the plurality of memory banks, on which the write process is predicted to be completed next. In response to the write process on the memory bank having the bank address stored by the entry indicated by HP is completed, the queue entry controller 285 may clear the entry indicated by HP and shift the head pointer register 134 such that HP indicates a subsequent entry of the cleared entry. Assuming for an example that HP indicates an entry Q1 storing a bank address of a memory bank B0, in response to completing the write process on the memory bank B0, the queue entry controller 285 may clear the entry Q1 and shift the head pointer register 134 such that HP indicates an entry Q2.

In one aspect, the queue entry controller 285 may block or unblock updating the queue register 132 according to HP and TP. For example, when HP is equal to TP (or HP and TP both point to the same entry), the queue entry controller 285 may block or prevent updating the queue register 132. When updating the queue register 132 is blocked, the queue entry controller 285 may instruct or cause the host processor to stop sending input bank addresses until updating the queue register 132 is unblocked. For example, when HP is different from TP (or HP and TP point to different entries), the queue entry controller 285 may unblock updating the queue register 132, thereby allowing the queue register 132 to be updated.

In some embodiments, the buffer interface circuit 290 is a hardware component or a circuit that configures or controls buffers (e.g., address buffers and data buffers) according to bank addresses stored by the queue register 132. In one approach, the buffer interface circuit 290 obtains bank addresses of a set of memory banks stored by a set of entries of the queue register 132. The buffer interface circuit 290 may identify one or more memory banks from the set of memory banks that are clear-to-write (or identify the one or more memory banks, on which the write process has not started). In response to identifying the one or more memory banks that are clear-to-write from the set of memory banks, the buffer interface circuit 290 may generate the control signals 125, 128 to configure one or more corresponding buffers (e.g., address buffers and data buffers) to begin the write process on the identified one or more memory banks. In case two or more entries store a bank address of a same memory bank, the buffer interface circuit 290 may prioritize an entry indicated by HP. Hence, the buffer interface circuit 290 may perform the write process on multiple memory banks in parallel or in a pipeline configuration, according to bank addresses stored by the queue register 132. Detailed descriptions on the example operation of the queue controller 280 are provided below with respect to FIGS. 3 through 8.

Figure 3:
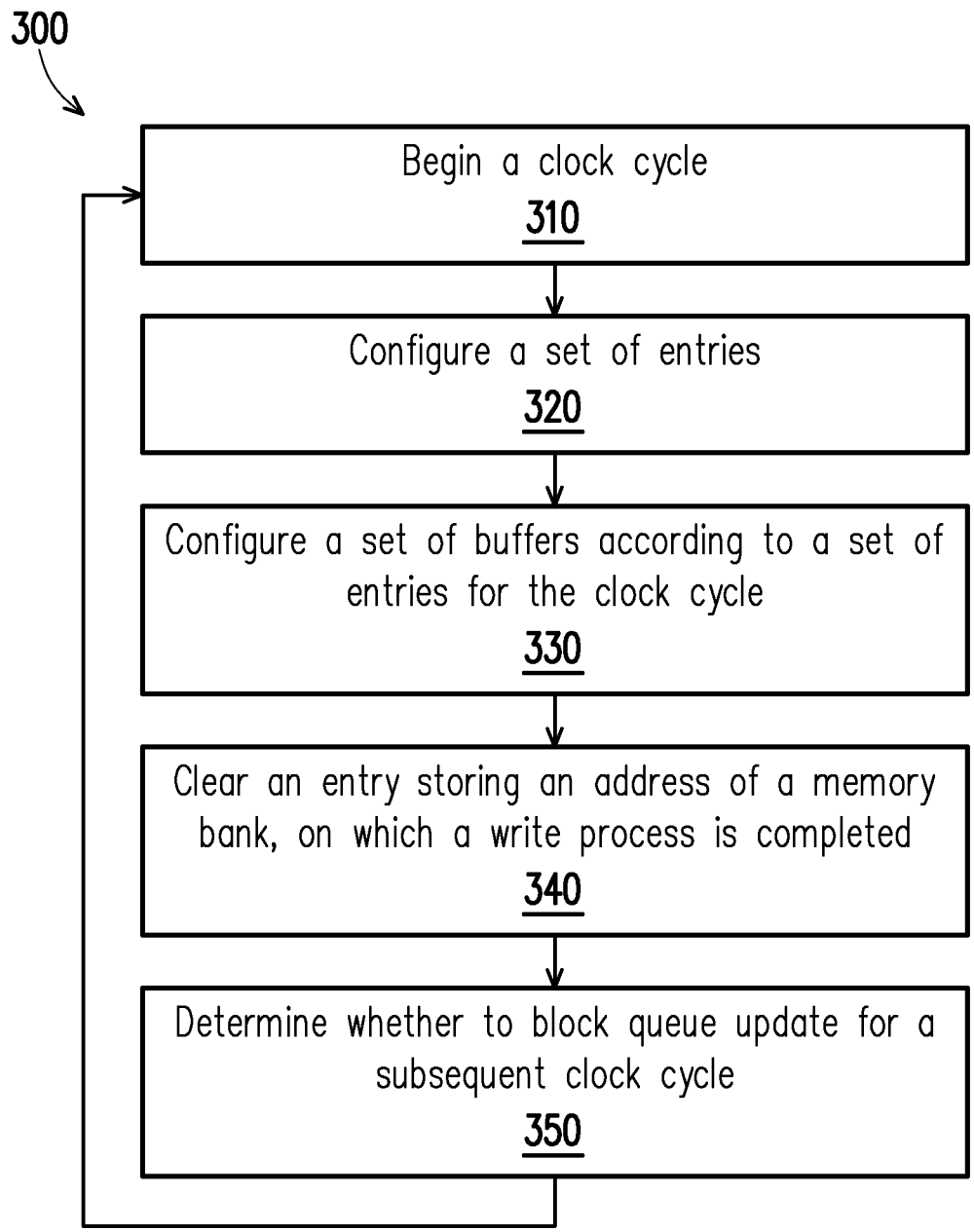
FIG. 3 is a flowchart of a method of updating a queue register of the buffer controller of FIG. 1 and configuring the buffers according to the queue register for multiple clock cycles, in accordance with some embodiments.

FIG. 3 is a flowchart of a method 300 of updating a queue register 132 of the buffer controller 130 of FIG. 1 and configuring the buffers (e.g., address buffers and data buffers) according to the queue register 132 for multiple clock cycles, in accordance with some embodiments. The method 300 may be performed by the buffer controller 130 of FIG. 1. In some embodiments, the method 300 is performed by other entities. In some embodiments, the method 300 includes more, fewer, or different operations than shown in FIG. 3.

In an operation 310, the buffer controller 130 begins the method 300 for a clock cycle. For example, the buffer controller 130 receives the clock signal 155, and detects an edge (e.g., rising edge) of the clock signal 155. In response to the edge (e.g., rising edge) of the clock signal 155, the buffer controller 130 may begin a process for a clock cycle.

In an operation 320, the buffer controller 130 configures a set of entries of the queue register 132. The buffer controller 130 may determine whether updating an entry is blocked or not. Whether updating the entry is blocked or not may be determined during a previous clock cycle. In case updating the entry is unblocked, the buffer controller 130 may update an entry indicated by TP and update the entry according to an input bank address from a host controller. In one approach, the queue entry controller 285 receives the input bank address at a beginning of the clock cycle or before beginning the clock cycle, and stores the input bank address at the entry indicated by TP. In case updating the entry is blocked, the buffer controller 130 may not update any of the set of entries of the queue register 132 according to an input bank address from the host processor and may cause or instruct the host controller to stop sending an input bank address.

In an operation 330, the buffer controller 130 configures a set of buffers according to the set of entries of the queue register 132 for the clock cycle. In one approach, the buffer controller 130 may obtain addresses of the set of memory banks stored by the set of entries and determine one or more memory banks of the set of memory banks that are clear-to-write. In addition, the buffer controller 130 may generate control signals 125, 128 to configure or control one or more buffers (e.g., address buffers and data buffers) coupled to or associated with the determined one or more memory banks to perform or initiate the write process. In case two or more entries store a bank address of a same memory bank, the buffer controller 130 may prioritize an entry indicated by HP.

In an operation 340, the buffer controller 130 clears an entry storing an address of a memory bank, on which the write process is completed. For example, the buffer controller 130 receives, from a memory bank having a bank address stored by an entry indicated by HP, a write complete signal indicating that the write process on the memory bank is completed. In response to the write complete signal, the buffer controller 130 may clear the entry indicated by HP and shift the head pointer register 134 such that HP indicates the subsequent entry.

In an operation 350, the buffer controller 130 may determine whether to block updating the queue register 132 for a subsequent clock cycle. In one approach, if HP and TP are equal (or both HP and TP indicate the same entry), then the buffer controller 130 may determine to block updating the queue register 132 for the subsequent clock cycle. If HP and TP are not equal (or HP and TP indicate different entries), then the buffer controller 130 may determine to unblock updating the queue register 132 for the subsequent clock cycle.

Advantageously, controlling or operating the buffers (e.g., address buffers and data buffers) can be performed in an efficient manner. In one implementation, each of the buffers D0 . . . DN-1, A0 . . . AN-1 may include a corresponding counter that keeps track of a number of clock cycles elapsed after the beginning of the write process, or a number of clock cycles remaining to complete the write process. However, for a large number of memory banks (e.g., thousand or more), a large number of counters to keep track of the number of clock cycles elapsed or remaining can consume a large amount of area or hardware resources. Moreover, configuring or controlling multiple buffers to perform the write process based on a large number of counters may involve a complex computation. By employing the buffer controller 130 with HP and TP to update or maintain a queue register for configuring or controlling different buffers, a large number (e.g., thousands) of counters to keep track of a number of clock cycles elapsed or a number of clock cycles remaining can be omitted. By omitting a large number of counters, an amount of areas or hardware resources can be conserved. Moreover, updating or maintaining the queue register for configuring or controlling different buffers without a large number of counters can be performed with less complexity.

Figure 4:
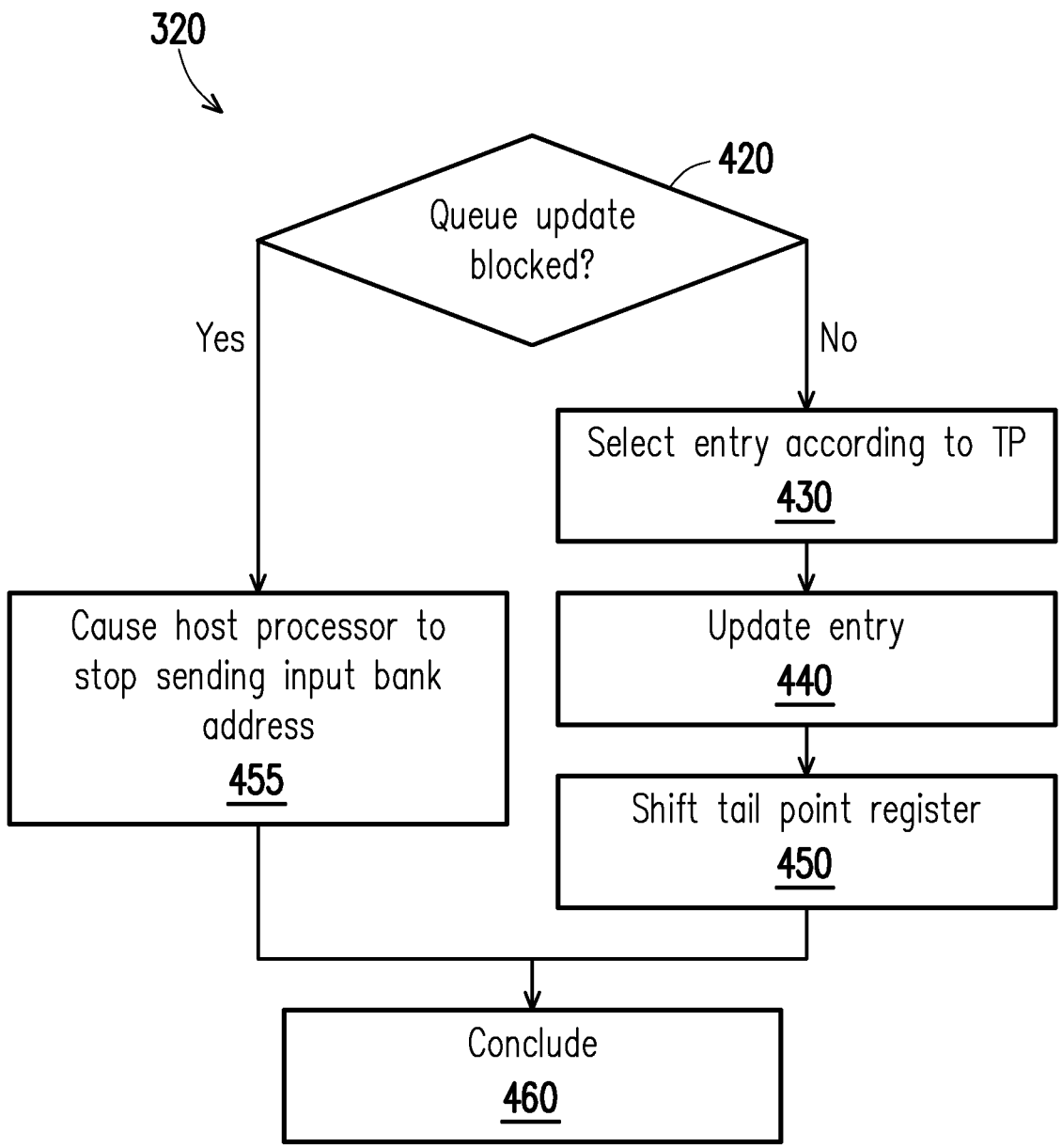
FIG. 4 is a flowchart of a method of updating a queue register of the buffer controller of FIG. 1, in accordance with some embodiments.

FIG. 4 is a flowchart of the operation 320 of updating the queue register 132 of the buffer controller 130 of FIG. 1, in accordance with some embodiments. The operation 320 may be performed by the queue entry controller 285 of the buffer controller 130 of FIG. 2. In some embodiments, the operation 320 is performed by other entities. In some embodiments, the operation 320 includes more, fewer, or different operations than shown in FIG. 4.

In an operation 420, the buffer controller 130 determines whether updating the queue register 132 for a clock cycle is blocked or not. Determining whether to update the queue register 132 may be performed during a previous clock cycle in an operation 350. In one approach, if HP and TP are equal, then the buffer controller 130 may block updating the queue register 132 for the clock cycle according to an input bank address from the host processor. If HP and TP are different, then the buffer controller 130 may unblock or allow updating the queue register 132 for the clock cycle.

In an operation 430, in response to determining that updating the queue register 132 is unblocked, the buffer controller 130 may select an entry among the set of entries of the queue register 132 indicated by TP. In an operation 440, the buffer controller 130 may update the selected entry. In one approach, the buffer controller 130 receives an input bank address from a host processor and stores the input bank address by the selected entry. In an operation 450, in response to updating the selected entry, the buffer controller 130 may shift the tail pointer register 136 such that TP points to a subsequent entry. Assuming for an example that TP indicates an entry Q1 in the operation 430, the buffer controller 130 may select the entry Q1 in the operation 430 according to TP. Then, in the operation 440, the buffer controller 130 may update the selected entry Q1 to store the input bank address, and shift the tail pointer register 136 such that TP indicates a subsequent entry Q2 in the operation 450.

In an operation 455, in response to determining that updating the queue register 132 is blocked, the buffer controller 130 may cause or instruct the host processor to stop sending a new input bank address, until the queue update is unblocked. Moreover, in response to determining that updating the queue register 132 is blocked, the buffer controller 130 may not update the queue register 132 according to the input bank address. In an operation 460, the buffer controller 130 may conclude the operation 320 for the clock cycle after the operation 455 or the operation 450 for the clock cycle and may proceed to the operation 330.

Figure 5:
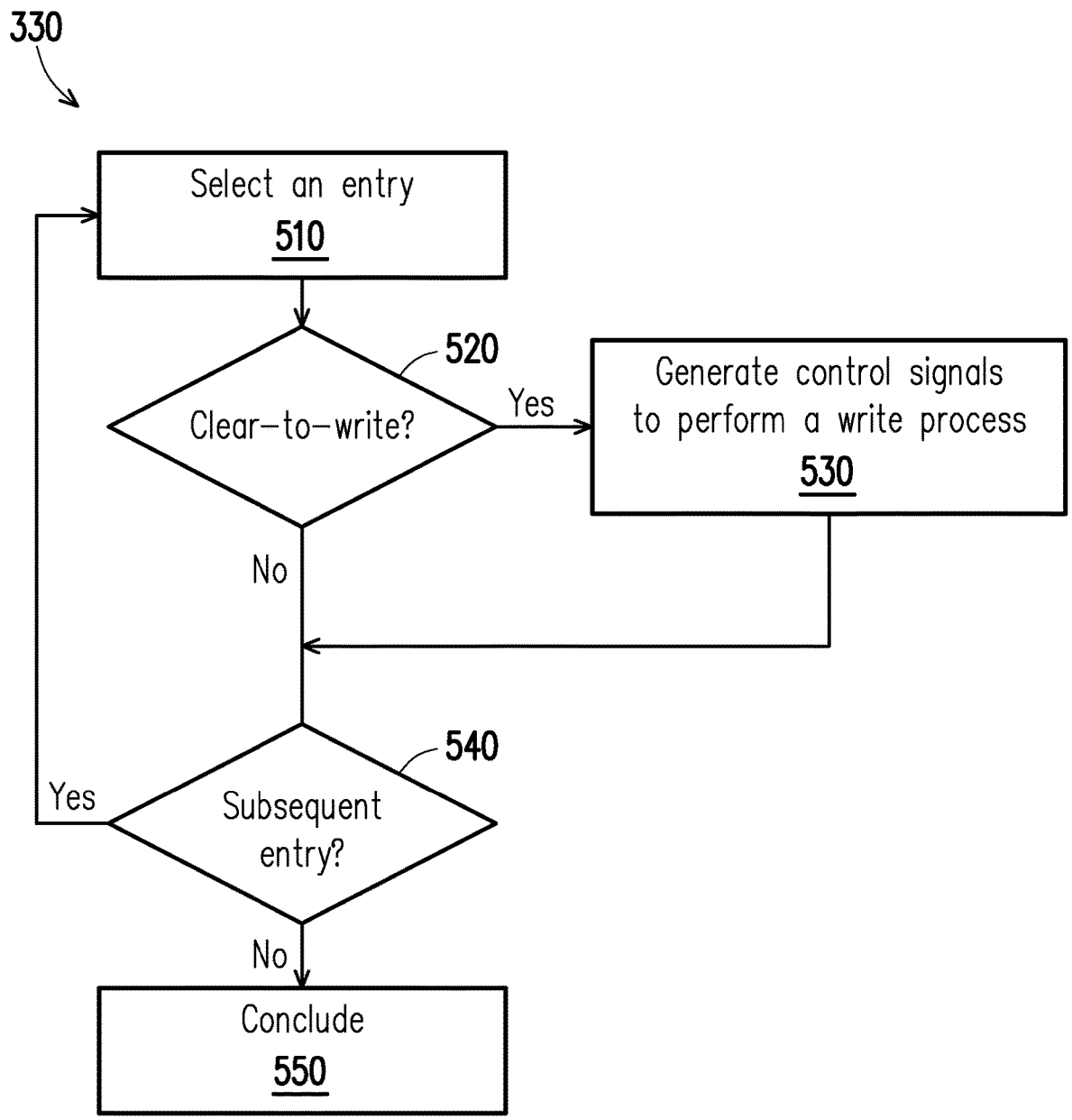
FIG. 5 is a flowchart of a method of configuring a set of buffers according to the queue register of FIG. 1 for a clock cycle, in accordance with some embodiments.

FIG. 5 is a flowchart of the operation 330 of configuring a set of buffers (e.g., address buffers and data buffers) according to the queue register 132 of FIG. 1 for a clock cycle, in accordance with some embodiments. The operation 330 may be performed by the buffer interface circuit 290 of the buffer controller 130. In some embodiments, the operation 330 is performed by other entities. In some embodiments, the operation 330 includes more, fewer, or different operations than shown in FIG. 5.

In an operation 510, the buffer controller 130 selects an entry among the set of entries of the queue register 132. In one approach, when beginning the operation 330, the buffer controller 130 may select an entry indicated by HP and identify a memory bank having an address stored by the selected entry.

In an operation 520, the buffer controller 130 determines whether the identified memory bank is clear to write. For example, the buffer controller 130 may query a buffer (e.g., address buffer or data buffer) coupled to the identified memory bank and receive a status signal indicating whether a write process is being performed or not. If the write process is being performed on the identified memory bank, the buffer controller 130 may determine that the identified memory bank is not clear-to-write. If the write process is not being performed on the identified memory bank, the buffer controller 130 may determine that the identified memory bank is clear-to-write.

In an operation 530, in response to determining that the identified memory bank is clear-to-write, the buffer controller 130 may configure one or more buffers (e.g., data buffer or address buffer) coupled to the identified memory bank to initiate or perform the write process. In one approach, the buffer controller 130 generates control signals 125, 128 to configure or control one or more buffers (e.g., address buffers and data buffers) to perform or initiate the write process on the identified memory bank.

In an operation 540, in response to determining that the identified memory bank is not clear-to-write or in response to generating the control signals for the identified memory bank in the operation 530, the buffer controller 130 determines whether a subsequent entry exists or not. If a subsequent entry exists (or the subsequent entry has not been examined for the clock cycle in the operation 330 yet), the buffer controller 130 may select the subsequent entry in the operation 510 and repeat the process. In an operation 550, if all of the set of entries have been examined and no subsequent entry exists, the buffer controller 130 may conclude the operation 330 for the clock cycle and may proceed to the operation 340.

Figure 6:
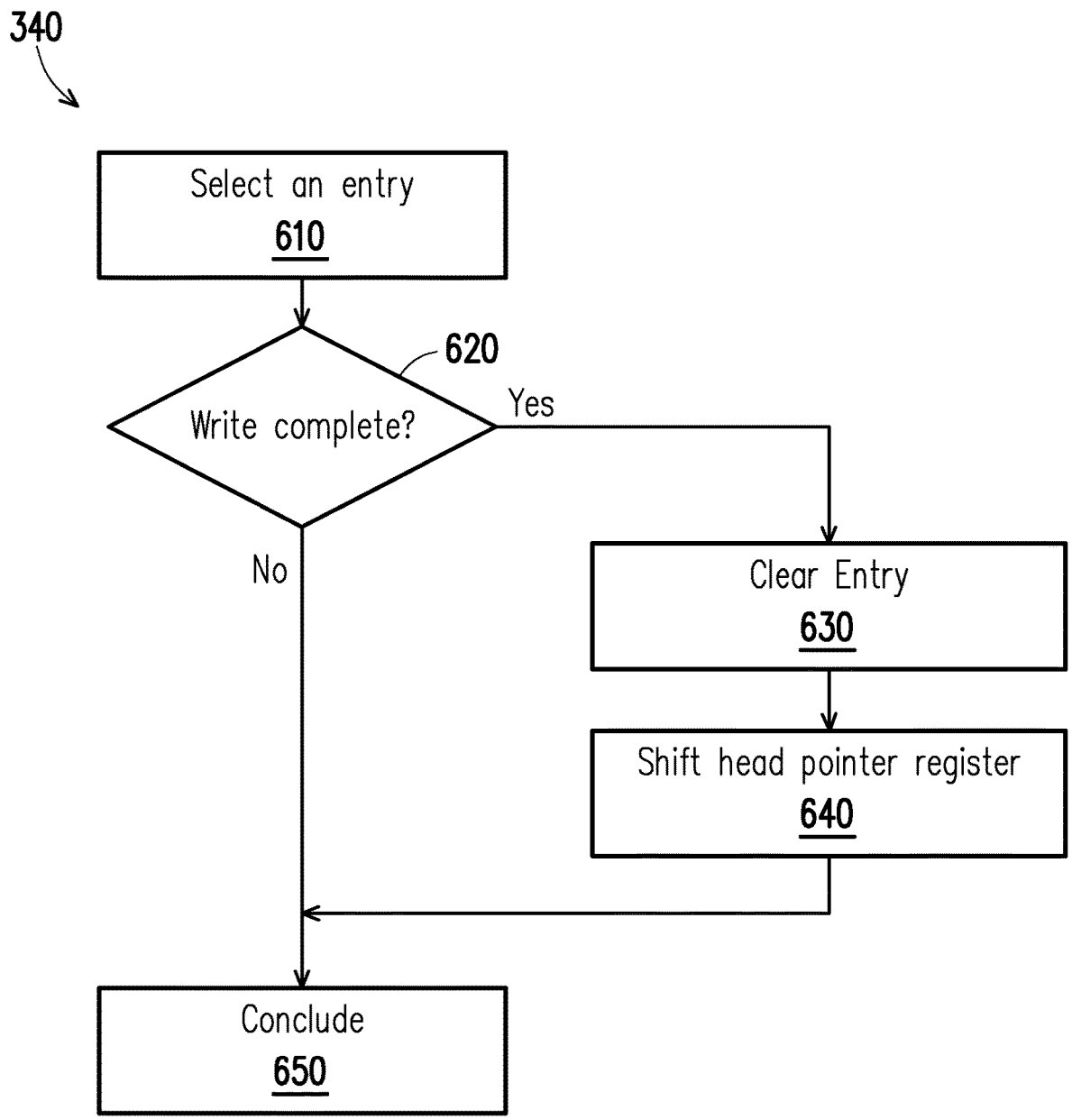
FIG. 6 is a flowchart of a method of clearing an entry of the queue register of FIG. 1, in accordance with some embodiments.

FIG. 6 is a flowchart of the operation 340 of clearing an entry of the queue register 132 of FIG. 1, in accordance with some embodiments. The operation 340 may be performed by the queue entry controller 285 of the buffer controller 130. In some embodiments, the operation 340 is performed by other entities. In some embodiments, the operation 340 includes more, fewer, or different operations than shown in FIG. 6.

In an operation 610, the buffer controller 130 selects an entry according to HP. The buffer controller 130 may select the entry, after configuring one or more buffers (e.g., address buffers, data buffers) in the operation 330. The buffer controller 130 may identify a memory bank having an address stored by the selected entry indicated by HP.

In an operation 620, the buffer controller 130 determines whether the write process on the selected entry is completed or not. For example, the buffer controller 130 receives a write complete signal from the identified memory bank indicating that the write process on the identified memory bank is completed. Hence, according to the write complete signal, the buffer controller 130 may determine whether the write process on the selected entry is completed or not.

In an operation 630, in response to determining that the write process on the identified memory bank is completed, the buffer controller 130 may clear the selected entry. In an operation 640, the buffer controller 130 may shift the head pointer register 134 in response to clearing the selected entry, such that HP indicates a subsequent entry. Assuming for an example that HP indicates an entry Q1 storing a bank address of a memory bank B0 in the operation 610, in response to completing the write process on the memory bank B0, the queue entry controller 285 may clear the entry Q1 in the operation 630, and shift the head pointer register 134 such that HP indicates an entry Q2 in the operation 640. In an operation 650, after the operation 640 or in response to determining that the write process on the identified memory bank is not completed in the operation 620, the buffer controller 130 may conclude the operation 340 for the clock cycle, and may proceed to the operation 350.

FIG. 7 is an example table 700 showing an operation of the buffer controller 130 of FIG. 1, in accordance with some embodiments. In the example shown in FIG. 7, a write process takes five clock cycles to write data to a memory buffer.

At clock cycle 0, the buffer controller 130 receives an input B0_1. B0 may correspond to the bank address of the memory bank B0 and a number following the underscore may correspond to a cell address or a number of data to be stored by the same memory bank. At clock cycle 0, the set of entries Q0-Q3 are empty, and HP and TP both indicate the entry Q0.

At clock cycle 1, updating the queue register 132 is unblocked, because no decision was made on whether to block updating the queue register 132. Hence, the buffer controller 130 may update the entry Q0 pointed by TP to store the input bank address B0, where the entry Q0 in the table 700 is shown to store B0_1 to differentiate or represent which input is being stored. After storing the input bank address B0, the buffer controller 130 may shift the tail pointer register 136 such that TP points to the entry Q1. The buffer controller 130 may configure the memory bank B0 according to bank address B0 stored by the entry Q0. For example, the buffer controller 130 may generate control signals 125, 128 to configure buffers (e.g., address buffer, data buffer) coupled to the memory bank B0 to perform or initiate a write process. The buffer controller 130 may determine to unblock updating the queue register 132 for the subsequent clock cycle 2, because HP points to the entry Q0 and TP points to the entry Q1. The buffer controller 130 may receive an input B1_1 before beginning the clock cycle 2.

At clock cycle 2, updating the queue register 132 is unblocked. Hence, the buffer controller 130 may update the entry Q1 pointed by TP to store the input bank address B1. After storing the input bank address B1, the buffer controller 130 may shift the tail pointer register 136 such that TP points to the entry Q2. The buffer controller 130 may configure the memory bank B1 according to bank address B1 stored by the entry Q1. For example, the buffer controller 130 may generate control signals 125, 128 to configure buffers (e.g., address buffer, data buffer) coupled to the memory bank B1 to perform or initiate a write process. The buffer controller 130 may determine to unblock updating the queue register 132 for the subsequent clock cycle 3, because HP points to the entry Q0 and TP points to the entry Q2. The buffer controller 130 may receive an input B2_1 before or at the beginning of the clock cycle 3.

At clock cycle 3, updating the queue register 132 is unblocked. Hence, the buffer controller 130 may update the entry Q2 pointed by TP to store the input bank address B2. After storing the input bank address B2, the buffer controller 130 may shift the tail pointer register 136 such that TP points to the entry Q3. The buffer controller 130 may configure the memory bank B2 according to bank address B2 stored by the entry Q2. For example, the buffer controller 130 may generate control signals 125, 128 to configure buffers (e.g., address buffer, data buffer) coupled to the memory bank B2 to perform or initiate a write process. The buffer controller 130 may determine to unblock updating the queue register 132 for the subsequent clock cycle 4, because HP points to the entry Q0 and TP points to the entry Q3. The buffer controller 130 may receive an input B3_1 before or at the beginning of the clock cycle 4.

At clock cycle 4, updating the queue register 132 is unblocked. Hence, the buffer controller 130 may update the entry Q3 pointed by TP to store the input bank address B3. After storing the input bank address B3, the buffer controller 130 may shift the tail pointer register 136 such that TP points to the entry Q0. The buffer controller 130 may configure the memory bank B3 according to bank address B3 stored by the entry Q3. For example, the buffer controller 130 may generate control signals 125, 128 to configure buffers (e.g., address buffer, data buffer) coupled to the memory bank B3 to perform or initiate a write process. The buffer controller 130 may determine to block updating the queue register 132 for the subsequent clock cycle 5, because HP and TP both point to the entry Q0. The buffer controller 130 may receive an input B0_2 before or at the beginning of the clock cycle 5.

At clock cycle 5, updating the queue register 132 is blocked. Hence, the buffer controller 130 may not update any entry according to input B0_2. Meanwhile, the write process on the memory bank B0 is completed. Hence, the buffer controller 130 may receive a write complete signal from the memory bank B0. According to the write complete signal, the buffer controller 130 may clear the entry Q0 pointed by HP, and shift the head pointer register 134 such that HP points to the entry Q1. The buffer controller 130 may determine to unblock updating the queue register 132 for the subsequent clock cycle 6, because HP points to the entry Q1 and TP points to the entry Q0.

At clock cycle 6, updating the queue register 132 is unblocked. Hence, the buffer controller 130 may update the entry Q0 pointed by TP to store the input bank address B0. After storing the input bank address B0, the buffer controller 130 may shift the tail pointer register 136 such that TP points to the entry Q1. The buffer controller 130 may configure the memory bank B0 according to bank address B0 stored by the entry Q0. For example, the buffer controller 130 may generate control signals 125, 128 to configure buffers (e.g., address buffer, data buffer) coupled to the memory bank B0 to perform or initiate a write process. Meanwhile, the write process on the memory bank B1 is completed. Hence, the buffer controller 130 may receive a write complete signal from the memory bank B1. According to the write complete signal, the buffer controller 130 may clear the entry Q1 pointed by HP, and shift the head pointer register 134 such that HP points to the entry Q2. The buffer controller 130 may determine to unblock updating the queue register 132 for the subsequent clock cycle 7, because HP points to the entry Q2 and TP points to the entry Q1. The buffer controller 130 may receive an input B1_2 before or at the beginning of the clock cycle 7.

At clock cycle 7, updating the queue register 132 is unblocked. Hence, the buffer controller 130 may update the entry Q1 pointed by TP to store the input bank address B1. After storing the input bank address B1, the buffer controller 130 may shift the tail pointer register 136 such that TP points to entry Q2. The buffer controller 130 may configure the memory bank B1 according to bank address B1 stored by the entry Q1. For example, the buffer controller 130 may generate control signals 125, 128 to configure buffers (e.g., address buffer, data buffer) coupled to the memory bank B1 to perform or initiate a write process. Meanwhile, the write process on the memory bank B2 is completed. Hence, the buffer controller 130 may receive a write complete signal from the memory bank B2. According to the write complete signal, the buffer controller 130 may clear the entry Q2 pointed by HP, and shift the head pointer register 134 such that HP points to the entry Q3. The buffer controller 130 may determine to unblock updating the queue register 132 for the subsequent clock cycle, because HP points to the entry Q3 and TP points to the entry Q2.

FIG. 8 is another example table 800 showing an operation of the buffer controller 130 of FIG. 1, in accordance with some embodiments. In the example shown in FIG. 8, a write process takes 5 clock cycles to write data to a memory buffer.

At clock cycle 0, the buffer controller 130 receives an input B0_1. B0 may correspond to the bank address of the memory bank B0 and a number following the underscore may correspond to a cell address or a number of data to be stored by the same memory bank. At clock cycle 0, the set of entries Q0-Q3 are empty, and HP and TP both indicate the entry Q0.

At clock cycle 1, updating the queue register 132 is unblocked, because no decision was made on whether to block updating the queue register 132. Hence, the buffer controller 130 may update the entry Q0 pointed by TP to store the input bank address B0 according to the input B0_1, where the entry Q0 in the table 800 is shown to store B0_1 to differentiate or represent which input is being stored. After storing the input bank address B0, the buffer controller 130 may shift the tail pointer register 136 such that TP points to the entry Q1. The buffer controller 130 may configure the memory bank B0 according to bank address B0 stored by the entry Q0. For example, the buffer controller 130 may generate control signals 125, 128 to configure buffers (e.g., address buffer, data buffer) coupled to the memory bank B0 to perform or initiate a write process. The buffer controller 130 may determine to unblock updating the queue register 132 for the subsequent clock cycle 2, because HP points to the entry Q0 and TP points to the entry Q1. The buffer controller 130 may receive an input B0_2 before beginning the clock cycle 2.

At clock cycle 2, updating the queue register 132 is unblocked. Hence, the buffer controller 130 may update the entry Q1 pointed by TP to store the input bank address B0 according to the input B0_2. After storing the input bank address B0, the buffer controller 130 may shift the tail pointer register 136 such that TP points to the entry Q2. Because the write process on the memory bank B0 according to the entry Q0 for input B0_1 is still pending, the memory bank B0 is not clear-to-write. Hence, the buffer controller 130 may not perform or start the write process on the memory bank B0 according to the entry Q1 for input B0_2. The buffer controller 130 may determine to unblock updating the queue register 132 for the subsequent clock cycle 3, because HP points to the entry Q0 and TP points to the entry Q2. The buffer controller 130 may receive an input B0_3 before or at the beginning of the clock cycle 3.

At clock cycle 3, updating the queue register 132 is unblocked. Hence, the buffer controller 130 may update the entry Q2 pointed by TP to store the input bank address B0 according to the input B0_3. After storing the input bank address B0, the buffer controller 130 may shift the tail pointer register 136 such that TP points to the entry Q3. Because the write process on the memory bank B0 according to the entry Q0 for input B0_1 is still pending, the memory bank B0 is not clear-to-write. Hence, the buffer controller 130 may not perform or start the write process on the memory bank B0 according to the entry Q2 for input B0_3. The buffer controller 130 may determine to unblock updating the queue register 132 for the subsequent clock cycle 4, because HP points to the entry Q0 and TP points to the entry Q3. The buffer controller 130 may receive an input B0_4 before or at the beginning of the clock cycle 4.

At clock cycle 4, updating the queue register 132 is unblocked. Hence, the buffer controller 130 may update the entry Q3 pointed by TP to store the input bank address B0 according to the input B0_4. After storing the input bank address B0, the buffer controller 130 may shift the tail pointer register 136 such that TP points to the entry Q0. Because the write process on the memory bank B0 according to the entry Q0 for input B0_1 is still pending, the memory bank B0 is not clear-to-write. Hence, the buffer controller 130 may not perform or start the write process on the memory bank B0 according to the entry Q3 for input B0_4. The buffer controller 130 may determine to block updating the queue register 132 for the subsequent clock cycle 5, because HP and TP point to the entry Q0. The buffer controller 130 may receive an input B0_5 before or at the beginning of the clock cycle 5.

At clock cycle 5, updating the queue register 132 is blocked. Hence, the buffer controller 130 may not update any entry according to input B0_5. Meanwhile, the write process on the memory bank B0 is completed. Hence, the buffer controller 130 may receive a write complete signal from the memory bank B0. According to the write complete signal, the buffer controller 130 may clear the entry Q0 pointed by HP, and shift the head pointer register 134 such that HP points to the entry Q1. The buffer controller 130 may determine to unblock updating the queue register 132 for the subsequent clock cycle 6, because HP points to the entry Q1 and TP points to the entry Q0. The buffer controller 130 may receive an input B0_6 before or at the beginning of the clock cycle 6.

At clock cycle 6, updating the queue register 132 is unblocked. Hence, the buffer controller 130 may update the entry Q0 pointed by TP to store the input bank address B0 according to the input B0_5. After storing the input bank address B0, the buffer controller 130 may shift the tail pointer register 136 such that TP points to the entry Q1. The buffer controller 130 may configure the memory bank B0 according to bank address B0 stored by the entry Q1 as indicated by HP. For example, the buffer controller 130 may generate control signals 125, 128 to configure buffers (e.g., address buffer, data buffer) coupled to the memory bank B0 to perform or initiate a write process for the input B0_2 (or according to the entry Q1 pointed by HP). The buffer controller 130 may determine to block updating the queue register 132 for the subsequent clock cycle 7, because HP and TP both point to the entry Q1.

At clock cycles 7-9, updating the queue register 132 is blocked. Meanwhile, the write process on the memory bank B0 according to the input B0_2 (or entry Q1) has not completed yet. Hence, HP and TP remain the same, and the buffer controller 130 keeps blocking the queue register 132 from being updated.

At clock cycle 10, updating the queue register 132 is blocked. Hence, the buffer controller 130 may not update any entry. Meanwhile, the write process on the memory bank B0 according to the input B0_2 (or entry Q1) is completed. Hence, the buffer controller 130 may receive a write complete signal from the memory bank B0. According to the write complete signal, the buffer controller 130 may clear the entry Q1 pointed by HP, and shift the head pointer register 134 such that HP points to the entry Q2. The buffer controller 130 may determine to unblock updating the queue register 132 for the subsequent clock cycle 11, because HP points to the entry Q2 and TP points to the entry Q1.

At clock cycle 11, updating the queue register 132 is unblocked. Hence, the buffer controller 130 may update the entry Q1 pointed by TP to store the input bank address B0 according to the input B0_6. After storing the input bank address B0, the buffer controller 130 may shift the tail pointer register 136 such that TP points to the entry Q2. The buffer controller 130 may configure the memory bank B0 according to bank address B0 stored by the entry Q2 as indicated by HP. For example, the buffer controller 130 may generate control signals 125, 128 to configure buffers (e.g., address buffer, data buffer) coupled to the memory bank B0 to perform or initiate a write process for the input B0_3 (or according to the entry Q2 pointed by HP). The buffer controller 130 may determine to block updating the queue register 132 for the subsequent clock cycle, because both HP and TP point to the entry Q2.

Advantageously, controlling or operating the buffers (e.g., address buffers and data buffers) can be performed in an efficient manner. In one implementation, each buffer D0 . . . DN−1, A0 . . . AN−1 may include a corresponding counter that keeps track of a number of clock cycles elapsed after the beginning of the write process, or a number of clock cycles remaining to complete the write process. However, for a large number of memory banks (e.g., thousand or more), a large number of counters to keep track of the number of clock cycles elapsed or remaining can consume a large amount of area or hardware resources. Moreover, configuring or controlling multiple buffers to perform the write process based on a large number of counters may involve a complex computation. By employing the buffer controller 130 with HP and TP to update or maintain a queue register for configuring or controlling different buffers, a large number (e.g., thousands) of counters to keep track of a number of clock cycles elapsed or a number of clock cycles remaining can be omitted. By omitting a large number of counters, an amount of areas or hardware resources can be conserved. Moreover, updating or maintaining the queue register for configuring or controlling different buffers without a large number of counters can be performed with less complexity.

Figure 9:
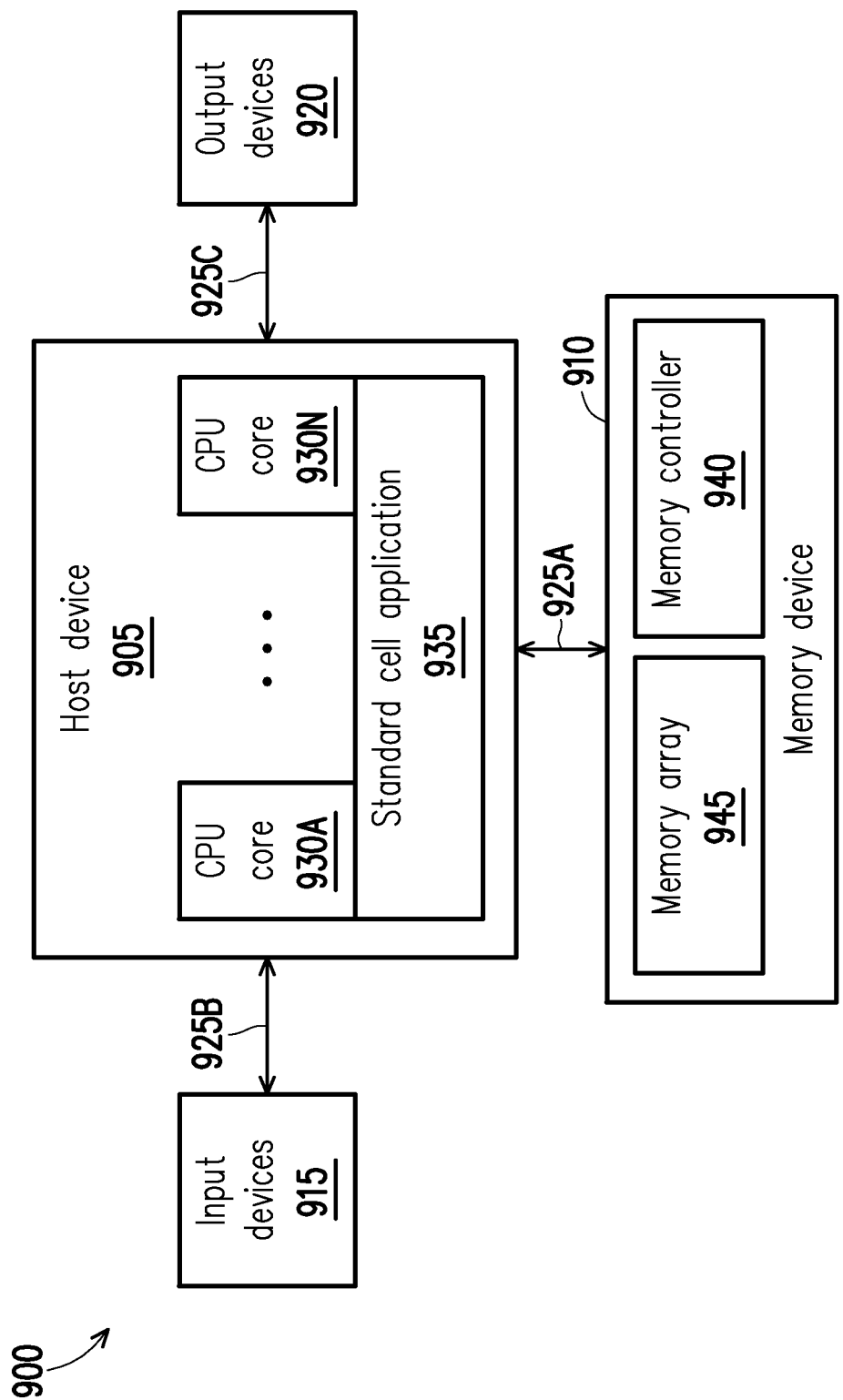
FIG. 9 is an example block diagram of a computing system, in accordance with some embodiments.

Referring now to FIG. 9, an example block diagram of a computing system 900 is shown, in accordance with some embodiments of the disclosure. The computing system 900 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 900 includes a host device 905 associated with a memory device 910. The host device 905 may be configured to receive input from one or more input devices 915 and provide output to one or more output devices 920. The host device 905 may be configured to communicate with the memory device 910, the input devices 915, and the output devices 920 via appropriate interfaces 925A, 925B, and 925C, respectively. The computing system 900 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 905.

The input devices 915 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 905 and that allows an external source, such as a user (e.g., a circuit or layout designer), to enter information (e.g., data) into the host device and send instructions to the host device. Similarly, the output devices 920 may include a variety of output technologies such as external memories, printers, speakers, displays, microphones, light emitting diodes, headphones, video devices, and any other output peripherals that are configured to receive information (e.g., data) from the host device 905. The "data" that is either input into the host device 905 and/or output from the host device may include any of a variety of textual data, circuit data, signal data, semiconductor device data, graphical data, combinations thereof, or other types of analog and/or digital data that is suitable for processing using the computing system 900.

The host device 905 includes or is associated with one or more processing units/processors, such as Central Processing Unit ("CPU") cores 930A-930N. The CPU cores 930A-90N may be implemented as an Application Specific Integrated Circuit ("ASIC"), Field Programmable Gate Array ("FPGA"), or any other type of processing unit. Each of the CPU cores 930A-930N may be configured to execute instructions for running one or more applications of the host device 905. In some embodiments, the instructions and data to run the one or more applications may be stored within the memory device 910. The host device 905 may also be configured to store the results of running the one or more applications within the memory device 910. Thus, the host device 905 may be configured to request the memory device 910 to perform a variety of operations. For example, the host device 905 may request the memory device 910 to read data, write data, update or delete data, and/or perform management or other operations. One such application that the host device 905 may be configured to run may be a standard cell application 935. The standard cell application 935 may be part of a computer aided design or electronic design automation software suite that may be used by a user of the host device 905 to use, create, or modify a standard cell of a circuit. In some embodiments, the instructions to execute or run the standard cell application 935 may be stored within the memory device 910. The standard cell application 935 may be executed by one or more of the CPU cores 930A-930N using the instructions associated with the standard cell application from the memory device 910. In one example, the standard cell application 935 allows a user to utilize pre-generated schematic and/or layout designs of the memory system 100 or a portion of the memory system 100 to aid integrated circuit design. After the layout design of the integrated circuit is complete, multiples of the integrated circuit, for example, including the memory system 100 or a portion of the memory system 100 can be fabricated according to the layout design by a fabrication facility.

Referring still to FIG. 9, the memory device 910 includes a memory controller 940 that is configured to read data from or write data to a memory array 945. The memory array 945 may include a variety of volatile and/or non-volatile memories. For example, in some embodiments, the memory array 945 may include NAND flash memory cores. In other embodiments, the memory array 945 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 945 may be individually and independently controlled by the memory controller 940. In other words, the memory controller 940 may be configured to communicate with each memory within the memory array 945 individually and independently. By communicating with the memory array 945, the memory controller 940 may be configured to read data from or write data to the memory array in response to instructions received from the host device 905. Although shown as being part of the memory device 910, in some embodiments, the memory controller 940 may be part of the host device 905 or part of another component of the computing system 900 and associated with the memory device. The memory controller 940 may be implemented as a logic circuit in either software, hardware, firmware, or combination thereof to perform the functions described herein. For example, in some embodiments, the memory controller 940 may be configured to retrieve the instructions associated with the standard cell application 935 stored in the memory array 945 of the memory device 910 upon receiving a request from the host device 905.

It is to be understood that only some components of the computing system 900 are shown and described in FIG. 9. However, the computing system 900 may include other components such as various batteries and power sources, networking interfaces, routers, switches, external memory systems, controllers, etc. Generally speaking, the computing system 900 may include any of a variety of hardware, software, and/or firmware components that are needed or considered desirable in performing the functions described herein. Similarly, the host device 905, the input devices 915, the output devices 920, and the memory device 910 including the memory controller 940 and the memory array 945 may include other hardware, software, and/or firmware components that are considered necessary or desirable in performing the functions described herein.

One aspect of this description relates to a memory system. In some embodiments, the memory system includes a plurality of memory banks and a plurality of buffers. In some embodiments, each of the plurality of buffers performs a write process to write data to a corresponding one of the plurality of memory banks. In some embodiments, the memory system includes a buffer controller including a queue register, a first pointer register, a second pointer register, and a queue controller. In some embodiments, the queue register includes a set of entries. In some embodiments, each of the set of entries stores an address of a corresponding memory bank of the plurality of memory banks. In some embodiments, the first pointer register indicates a first entry of the set of entries storing an address of a memory bank, on which the write process is predicted to be completed next among the plurality of memory banks. In some embodiments, the second pointer register indicates a second entry of the set of entries to be updated. In some embodiments, the queue controller configures the set of entries according to the first pointer register and the second pointer register, and configures one or more buffers of the plurality of buffers to perform the write process according to the set of entries.

One aspect of this description relates to a method of operating memory banks. In some embodiments, the method includes determining, by a buffer controller, whether to block updating a queue register for a first clock cycle according to a first pointer register and a second pointer register. In some embodiments, the queue register includes a set of entries, where each of the set of entries stores an address of a corresponding memory bank of a plurality of memory banks. In some embodiments, each of a plurality of buffers performs a write process for a number of clock cycles to write data to a corresponding one of the plurality of memory banks. In some embodiments, the first pointer register indicates a first entry of the set of entries storing an address of a memory bank, on which the write process on the memory bank is predicted to be completed next among the plurality of memory banks. In some embodiments, the second pointer register indicates a second entry of the set of entries to be updated. In some embodiments, the method includes selecting, by the buffer controller for the first clock cycle, the second entry, in response to determining that updating the queue register for the first clock cycle is unblocked. In some embodiments, the method includes updating, by the buffer controller for the first clock cycle, the second entry according to an input address of a target memory bank of the plurality of memory banks to store input data through the write process. In some embodiments, the method includes configuring, by the buffer controller, one or more buffers of the plurality of buffers for the first clock cycle to perform the write process, according to the set of entries including the updated second entry.

One aspect of this description relates to an integrated circuit for configuring memory banks. In some embodiments, the integrated circuit includes a queue register including a set of entries. In some embodiments, each of the set of entries stores an address of a corresponding memory bank of a plurality of memory banks. In some embodiments, each of a plurality of buffers performs a write process for a number of clock cycles to write data to a corresponding one of the plurality of memory banks. In some embodiments, the integrated circuit includes a first pointer register indicating a first entry of the set of entries storing an address of a memory bank, on which the write process on the memory bank is predicted to be completed next among the plurality of memory banks. In some embodiments, the integrated circuit includes a second pointer register indicating a second entry of the set of entries to be updated. In some embodiments, the integrated circuit includes a queue controller. In some embodiments, the queue controller updates, for a first clock cycle, the second entry according to an input address of a target memory bank of the plurality of memory banks to store input data through the write process. In some embodiments, the queue controller shifts the second pointer register to indicate a third entry subsequent to the second entry, in response to updating the second entry. In some embodiments, the queue controller configures, for the first clock cycle, one or more buffers of the plurality of buffers to perform the write process, according to the set of entries including the updated second entry. In some embodiments, the queue controller compares the first entry indicated by the first pointer register and third entry indicated by the second pointer register to determine whether to block updating the queue register for a second clock cycle subsequent to the first clock cycle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system comprising:
   a plurality of memory banks;
   a plurality of buffers, wherein each of the plurality of buffers is to perform a write process to write data to a corresponding one of the plurality of memory banks; and
   a buffer controller including:
      a queue register including a set of entries, wherein each of the set of entries is to store an address of a corresponding memory bank of the plurality of memory banks,
      a first pointer register indicating a first entry of the set of entries storing an address of a memory bank, on which the write process is predicted to be completed next among the plurality of memory banks,
      a second pointer register indicating a second entry of the set of entries to be updated, and
      a queue controller to:
         configure the set of entries according to the first pointer register and the second pointer register, and
         configure one or more buffers of the plurality of buffers to perform the write process, according to the set of entries.

2. The system of claim 1, wherein the queue controller is to configure the set of entries according to the first pointer register and the second pointer register by:
   determining whether updating the queue register for a first clock cycle is blocked or unblocked,
   updating the second entry indicated by the second pointer register according to an input address of a target memory bank of the plurality of memory banks to store input data through the write process, in response to determining that updating the queue register for the first clock cycle is unblocked, and
   shifting the second pointer register to indicate a third entry subsequent to the second entry, in response to updating the second entry.

3. The system of claim 2, wherein the queue controller is to configure the one or more buffers of the plurality of buffers to perform the write process for the first clock cycle according to the set of entries including the updated second entry.

4. The system of claim 3, wherein the queue controller is to configure the one or more buffers of the plurality of buffers to perform the write process for the first clock cycle by:
   obtaining addresses of a set of memory banks stored by the set of entries,
   identifying one or more memory banks from the set of memory banks, on which the write process has completed, and
   configuring the one or more buffers to perform the write process on the one or more memory banks for the first clock cycle.

5. The system of claim 3, wherein the queue controller is to determine whether to block updating the queue register for a second clock cycle subsequent to the first clock cycle, in response to configuring the one or more buffers of the plurality of buffers to perform the write process for the first clock cycle.

6. The system of claim 5, wherein the queue controller is to determine whether to block updating the queue register for the second clock cycle by:
comparing the first entry indicated by the first pointer register and the third entry indicated by the second pointer register, and
determining whether to block updating the queue register for the second clock cycle according to the comparison.

7. The system of claim 6, wherein the queue controller is to determine to block updating the queue register for the second clock cycle, in response to the first entry indicated by the first pointer register being equal to the third entry indicated by the second pointer register.

8. The system of claim 6, wherein the queue controller is to determine to unblock updating the queue register for the second clock cycle, in response to the first entry indicated by the first pointer register and the third entry indicated by the second pointer register being different.

9. The system of claim 1, wherein the queue controller is to:
clear the first entry, in response to receiving, from the memory bank, a write complete signal indicating that the write process on the memory bank has completed, and
shift the first pointer register to indicate a fourth entry subsequent to the first entry, in response to clearing the first entry.

10. The system of claim 1, wherein the first pointer register and the second pointer register are embodied as shift registers.

11. A method comprising:
determining, by a buffer controller, whether to block updating a queue register for a first clock cycle according to a first pointer register and a second pointer register, wherein the queue register includes a set of entries, wherein each of the set of entries is to store an address of a corresponding memory bank of a plurality of memory banks, wherein each of a plurality of buffers is to perform a write process for a number of clock cycles to write data to a corresponding one of the plurality of memory banks, wherein the first pointer register indicates a first entry of the set of entries storing an address of a memory bank, on which the write process is predicted to be completed next among the plurality of memory banks, wherein the second pointer register indicates a second entry of the set of entries to be updated;
selecting, by the buffer controller for the first clock cycle, the second entry, in response to determining that updating the queue register for the first clock cycle is unblocked;
updating, by the buffer controller for the first clock cycle, the second entry according to an input address of a target memory bank of the plurality of memory banks to store input data through the write process; and
configuring, by the buffer controller, one or more buffers of the plurality of buffers for the first clock cycle to perform the write process, according to the set of entries including the updated second entry.

12. The method of claim 11, further comprising:
shifting, by the buffer controller, the second pointer register to indicate a third entry subsequent to the second entry, in response to updating the second entry.

13. The method of claim 11, further comprising:
determining, by the buffer controller, whether to block updating the queue register for a second clock cycle subsequent to the first clock cycle according to the first pointer register and the second pointer register.

14. The method of claim 11, wherein determining, by the buffer controller, whether to block updating the queue register for the first clock cycle according to the first pointer register and the second pointer register includes:
comparing, by the buffer controller, the first entry indicated by the first pointer register and the second entry indicated by the second pointer register, and
determining, by the buffer controller, whether to block updating the queue register for the first clock cycle according to the comparison.

15. The method of claim 14, wherein determining whether to block updating the queue register for the first clock cycle according to the comparison includes:
determining, by the buffer controller, to block updating the queue register for the first clock cycle, in response to the first entry indicated by the first pointer register being equal to the second entry indicated by the second pointer register; and
determining, by the buffer controller, to unblock updating the queue register for the first clock cycle, in response to the first entry indicated by the first pointer register and the second entry indicated by the second pointer register being different.

16. The method of claim 11, further comprising:
clearing, by the buffer controller, the first entry, in response to receiving, from the memory bank, a write complete signal indicating that the write process on the memory bank has completed; and
shifting, by the buffer controller, the first pointer register to indicate a third entry subsequent to the first entry, in response to clearing the first entry.

17. An integrated circuit comprising:
a queue register including a set of entries, wherein each of the set of entries is to store an address of a corresponding memory bank of a plurality of memory banks, wherein each of a plurality of buffers is to perform a write process for a number of clock cycles to write data to a corresponding one of the plurality of memory banks;
a first pointer register indicating a first entry of the set of entries storing an address of a memory bank, on which the write process is predicted to be completed next among the plurality of memory banks;
a second pointer register indicating a second entry of the set of entries to be updated; and
a queue controller to:
update, for a first clock cycle, the second entry according to an input address of a target memory bank of the plurality of memory banks to store input data through the write process,
shift the second pointer register to indicate a third entry subsequent to the second entry, in response to updating the second entry,
configure, for the first clock cycle, one or more buffers of the plurality of buffers to perform the write process, according to the set of entries including the updated second entry, and
compare the first entry indicated by the first pointer register and the third entry indicated by the second pointer register to determine whether to block updating the queue register for a second clock cycle subsequent to the first clock cycle.

18. The integrated circuit of claim 17, wherein the queue controller is to:
   determine to block updating the queue register for the second clock cycle, in response to the first entry indicated by the first pointer register being equal to the third entry indicated by the second pointer register.

19. The integrated circuit of claim 17, wherein the queue controller is to:
   determine to unblock updating the queue register for the second clock cycle, in response to the first entry indicated by the first pointer register and the third entry indicated by the second pointer register being different.

20. The integrated circuit of claim 17, wherein the first pointer register and the second pointer register are embodied as shift registers.

* * * * *